United States Patent [19]

Diepeveen

[11] 4,142,714
[45] Mar. 6, 1979

[54] WIRE CLAMP

[76] Inventor: John C. Diepeveen, 1737 Kimberly Dr., Sunnyvale, Calif. 94086

[21] Appl. No.: 905,310

[22] Filed: May 12, 1978

[51] Int. Cl.² .............................................. B25B 11/00
[52] U.S. Cl. .......................................... 269/8; 228/47; 269/157; 269/238
[58] Field of Search ............................ 269/8, 157, 238; 228/4.5, 47; 83/575; 279/1 M

[56] References Cited
U.S. PATENT DOCUMENTS

| | | | |
|---|---|---|---|
| 3,080,784 | 3/1963 | Schneider | 83/575 X |
| 3,665,798 | 5/1972 | Tapert et al. | 83/575 |
| 3,672,556 | 6/1972 | Diepeveen | 269/161 |
| 3,963,229 | 6/1976 | Duynhoven | 269/8 |

*Primary Examiner*—Robert C. Watson
*Attorney, Agent, or Firm*—Townsend and Townsend

[57] ABSTRACT

A wire clamp for a wire bonding machine, wherein the wire clamp includes a pair of relatively shiftable wire-clamping jaws, one of the jaws having a magnet thereon which is normally attracted to a stop and engages the stop when the jaws are open. A coil adjacent to and spaced from the magnet moves the magnet away from the stop to close the jaws when the coil is energized.

10 Claims, 3 Drawing Figures

WIRE CLAMP

This invention relates to improvements in wire clamps of the type having a pair of relatively shiftable jaws for clamping a wire therebetween and, more particularly, to a wire clamp suitable for use with a wire bonder.

BACKGROUND OF THE INVENTION

Wire clamps have been used with wire bonders to pull wires from bonds after the bonds have been made on semicnductor chips. The bonding wire is very fine, of the order of 10 mils or less. Thus, the wire is very easily broken if subjected to shock and other forces. It is desirable, therefore, that such shocks and forces be minimized or eliminated if at all possible.

A wire clamp previously used on a wire bonder is of the type disclosed in U.S. Pat. No. 3,672,556. This wire clamp is disclosed as having two relatively shiftable jaws, a solenoid which attracts an armature, the latter having a projection which engages a screw on the end of one of the jaws to cause the jaw to move toward and engage the opposite jaw to thereby close the jaws to engage or clamp a wire therebetween. The armature impacts the core of the solenoid when the jaws are closed and this impact is transmitted as a shock through the support for the wire clamp and to the capillary which feeds the wire to a bonding tool. This shock occurs when the bonding tool is, in fact, bonding the wire to a terminal point on a semiconductor chip. This shock, in travelling through the capillary end of the tool is oftentimes sufficient to cause the wire to break because the wire is of such small diameter. When this occurs, the bond is defective and must be redone to avoid a defective component. The cause of this defect is, of course, the impact which is transmitted to the capillary holding the wire at the bond point during a bonding operation. It has been recognized, therefore, that this impact must be eliminated to thereby eliminate the possibility of wire breakage. A need has, therefore, arisen for an improved wire clamp which operates in a manner which does not produce a shock when the jaws of the wire clamp are closed so that the wire can be clamped properly without affecting the wire at the bond point.

SUMMARY OF THE INVENTION

The present invention provides a wire clamp which satisfies the above need, wherein the wire clamp operates to close a pair of relatively shiftable jaws without causing any contact between a solenoid and the part attracted to it when the solenoid is energized. In this way, mechanical shock associated with the energizing of the solenoid is completely eliminated.

To this end, the invention includes a solenoid on a support which also carries a pair of relatively shiftable wire-clamping jaws. One of the jaws is pivotally mounted to the support and has a magnet thereon which is adjacent to and spaced from the core of the solenoid and is normally attracted to an abutment when the solenoid is not energized. Thus, this assures that the jaws will be opened so that a fine wire can pass therebetween. When the solenoid is energized, the magnet is attracted to the core of the solenoid but does not contact it. The magnet moves away from the abutment and makes no contact with any structure on the support; thus, there is no impact or shock which is transmitted from the support to the remaining part of the system and to the capillary as is the problem associated with a prior wire clamp of the type described. Thus, the problem of breaking of the wire of the bond due to such a shock force is completely eliminated and defects in the resulting component are nonexistent with respect to this cause.

The primary object of this invention is to provide an improved wire clamp for a wire bonding machine which operates in a manner to close a pair of relatively shiftable jaws without creating a shock or other impact force so that such shocks or impact forces are not transferred to the system through the capillary for the wire bonding machine which would otherwise break the wire at the time the capillary is effecting a bond.

Another object of this invention is to provide a wire clamp of the type described, wherein the wire clamp has a magnet attached to the shiftable jaw thereof and the magnet is attracted to a solenoid when the latter is energized, yet the magnet does not contact the solenoid or any other structure to thereby avoid the possibility of impact at the time the jaws close and thereby eliminates shock impact forces transferred to the system through the capillary which carries the wire.

Other objects of this invention will become apparent as the following specification progresses, reference being had to the accompanying drawing for an illustration of the wire clamp of the invention.

IN THE DRAWING

Figure 1:
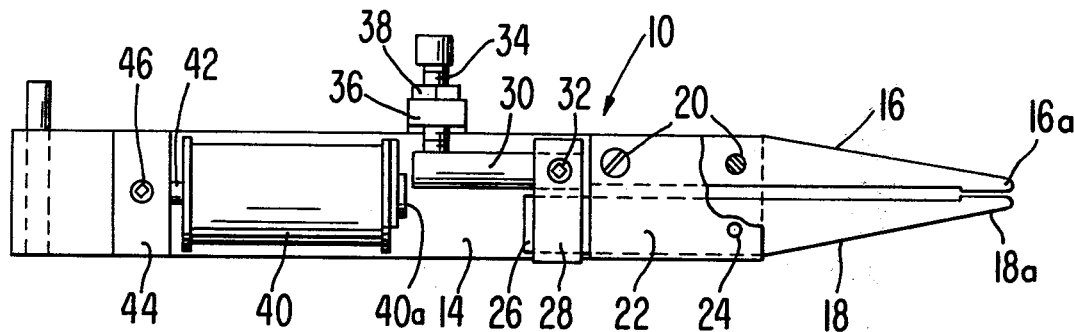
FIG. 1 is a top plan view of the wire clamp showing the jaws open.
Figure 3:
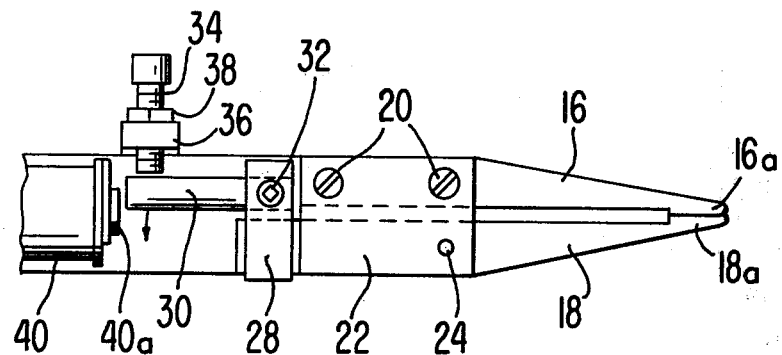
FIG. 3 is a view similar to FIG. 1 but showing the jaws closed.

The wire clamp of the present invention is broadly denoted by the numeral 10 and includes a support in the form of a rigid bar 12 having a flat upper surface 14 and adapted to be mounted on a wire bonding machine in any suitable manner. Wire clamp 10 includes a pair of wire clamping jaws 16 and 18, jaw 16 being fixed by a pair of screws 20 to upper surface 14 of bar 12. A plate 22 is also secured by screws 20 to bar 12 and has a pivot pin 24 which pivotally mounts jaw 18 on bar 12 for movement relevant to jaw 16. When the jaws are open as shown in FIG. 1, a thin wire can be inserted in the gap between the ends 16a and 18a of the jaws. When the jaws are closed as shown in FIG. 3, the jaws clamp the wire in the gap between ends 16a and 18a, FIG. 3 showing the jaws fully closed although there will be a slight gap between the jaw ends when the wire is therebetween.

Jaw 18 at its rear end 26 has an upright member 28 secured thereto. A bar magnet 30 is carried by member 28 near its upper end, and extends away from member 28, magnet 30 being releasably secured to member 28 by a set screw 32 threaded into member 28.

The rear end of magnet 30 is normally magnetically attracted to one end of a metallic screw 34 threadably mounted in a side member 36 secured to bar 12. A lock nut 38 on screw 34 is used to fix the adjustment or position thereof relative to magnet 30.

Figure 2:
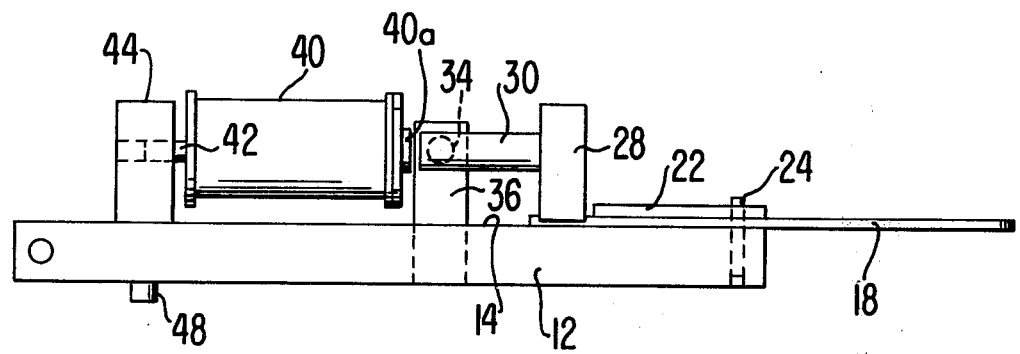
FIG. 2 is a side elevational view of the wire clamp.

A solenoid 40 having a core 40a is carried on bar 12 rearwardly of magnet 30 and is spaced from the magnet as shown in FIGS. 1 and 2. Solenoid 40 has a stub shaft 42 projecting rearwardly therefrom and the stub shaft is releasably secured to a second upright member 44 by a set screw 46, member 44 being secured by a screw 48 to bar 12 so that the solenoid extends longitudinally of bar 12.

In operation, the jaws of wire clamp 10 are normally open and the magnet 30 normally is attracted to and engages screw 34. When a wire to be clamped is inserted in the gap between jaw ends 16a and 18a and when it is desired to clamp onto the wire, solenoid 40 is energized to create a magnetic field through its core 40a, and this magnetic field attracts magnet 30, causing it to move away from screw 34 and toward a position in generally axial alignment with the central axis of the solenoid. This shown in FIG. 3. When this occurrs, the jaw ends close onto the wire therebetween and clamp the wire. Then, wire clamp 10 itself can be shifted in a known manner to cause breakage of the wire at the desired location. When the solenoid is deenergized, the jaws open and magnet 30 returns to the FIG. 1 position thereof.

It is evident that there is no physical connection between the solenoid and the magnet. Thus, there can be no impact between the solenoid and any part of the wire clamp itself. As a result, there will be no impact or shock forces transmitted to bar 12 and then through the structure to which the bar is attached. This will eliminate the bad side effects due to shock encountered in the prior wire clamps.

I claim:

1. A wire clamp comprising: a support; a pair of wire-clamping jaws mounted on the support, one of the jaws being movable relative to the other jaw; a magnet secured to one of the jaws, said support having a projection thereon, the magnet being attracted to the projection to hold said one jaw away from the other jaw to open the wire-receiving gap therebetween; and means adjacent to the magnet for creating a magnetic field having a magnitude and direction sufficient to cause the magnet to move away from the projection to move said one jaw toward the other jaw to clamp a wire in said gap.

2. A wire clamp as set forth in claim 1, wherein said magnet comprises a bar magnet, said projection comprising an adjustable stop in the path of movement of the magnet.

3. A wire clamp as set forth in claim 2, wherein said stop includes a screw, said support having a side member threadably mounting said screw thereon.

4. A wire clamp as set forth in claim 1, wherein said creating means includes a solenoid having an end spaced from and adjacent to the magnet.

5. A wire clamp as set forth in claim 4, wherein said support includes a bar, said jaws being adjacent to one end of the bar, the solenoid being adjacent to the opposite end of the bar, said magnet extending longitudinally of the bar between the jaws and the solenoid.

6. A wire clamp as set forth in claim 5, wherein said one jaw has means intermediate its ends for pivotally mounting said one jaw on said bar, there being means mounting said magnet on said one jaw at the end thereof remote from said gap with the magnet extending away from said jaws and toward said solenoid.

7. A wire clamp as set forth in claim 6, wherein said magnet is adjustably mounted on said one jaw.

8. A wire clamp as set firth in claim 5, wherein said projection includes an adjustable stop, said magnet normally engaging said stop when said gap is open.

9. A wire clamp as set forth in claim 8, wherein said bar has a side member secured thereto and extending upwardly therefrom, said stop including a screw threadably carried by said side member near the upper end thereof.

10. A wire clamp as set forth in claim 1, wherein said one jaw has means between the gap and the magnet for pivotally mounting said one jaw on the support.

* * * * *